United States Patent [19]
Koizumi et al.

[11] Patent Number: 5,698,892
[45] Date of Patent: Dec. 16, 1997

[54] IMAGE PICKUP ELEMENT AND IMAGE PICKUP DEVICE HAVING SCRIBE LINES COMPOSED OF TWO PORTIONS WITH DIFFERENT LAYER STRUCTURE

[75] Inventors: Toru Koizumi, Yokohama; Yoshio Koide, Isehara, both of Japan

[73] Assignee: Canon Kabushiki Kaisha, Tokyo, Japan

[21] Appl. No.: 581,904

[22] Filed: Jan. 2, 1996

[30] Foreign Application Priority Data

Jan. 6, 1995 [JP] Japan .................. 7-000643

[51] Int. Cl.$^6$ .................. H01L 27/148; H01L 29/80; H01L 23/544
[52] U.S. Cl. .................. 257/620; 257/222; 257/223; 257/233; 257/234; 257/229; 257/258; 257/291
[58] Field of Search .................. 250/208.1; 257/233, 257/234, 229, 290, 291, 257, 258, 461, 620

[56] References Cited

U.S. PATENT DOCUMENTS

| | | | |
|---|---|---|---|
| 5,135,891 | 8/1992 | Ikeno et al. | 437/228 |
| 5,136,354 | 8/1992 | Morita et al. | 357/40 |
| 5,432,363 | 7/1995 | Kamsaka et al. | 257/233 |
| 5,537,229 | 7/1996 | Brandestini et al. | 257/89 |

FOREIGN PATENT DOCUMENTS

| | | |
|---|---|---|
| 63-021604 | 1/1988 | Japan . |
| 02264468 | 10/1990 | Japan . |
| 03014268 | 1/1991 | Japan . |

*Primary Examiner*—Tom Thomas
*Assistant Examiner*—Fetsum Abraham
*Attorney, Agent, or Firm*—Fitzpatrick, Cella, Harper & Scinto

[57] ABSTRACT

In order to eliminate film thickness nonuniformity of filters and to attain a cost reduction by simultaneously performing planarizing processes of a scribe region and a photoelectric conversion portion, in a color solid-state image pickup device which is separated into a plurality of color solid-state image pickup chips each of which consists of a photoelectric conversion portion and a peripheral circuit portion thereof formed on a semiconductor substrate, a portion of a scribe region for separating the structure on the semiconductor substrate into the color solid-state image pickup chips has a layer structure having the same layers as the photoelectric conversion portion. This invention is also applied to a chip array type color solid-state image pickup device which is constituted by arranging, on a semiconductor substrate, a plurality of color solid-state image pickup chips, each having an array of a plurality of photoelectric conversion portions.

8 Claims, 9 Drawing Sheets

IMAGE PICKUP ELEMENT AND IMAGE PICKUP DEVICE HAVING SCRIBE LINES COMPOSED OF TWO PORTIONS WITH DIFFERENT LAYER STRUCTURE

BACKGROUND OF THE INVENTION

1. Field of the Invention

The present invention relates to a solid-state image pickup device and, more particularly, to a scribe process of a color solid-state image pickup device chip.

2. Related Background Art

The manufacturing process of a color solid-state image pickup device is roughly classified into three processes, i.e., (1) a semiconductor process, (2) a color filter process, and (3) a mounting process. In the semiconductor process, a photoelectric conversion portion for receiving light and converting it into an electrical signal, and a peripheral circuit portion are formed on a semiconductor wafer. In the color filter process, color filters are formed on the semiconductor in the form of the wafer. Thereafter, in the mounting step, a mounting operation such as wiring is performed in units of chips.

An existing color solid-state image pickup device is required to have multi-functions and high precision, and adopts a multi-layered wiring structure. As a result, some insulating layers are stacked on the photoelectric conversion portion. When a solid-state image pickup chip is cut from the wafer, the insulating layers are removed from a ruling scribe region, i.e., a semiconductor substrate is exposed, at the end of the semiconductor process, so as to protect the blade of a dicing cutter and prevent the insulating layers from cracking. Then, the blade of the dicing cutter is put on the scribe region to cut the wafer, thus obtaining respective solid-state image pickup devices of solid state image pickup chips.

Figure 9:
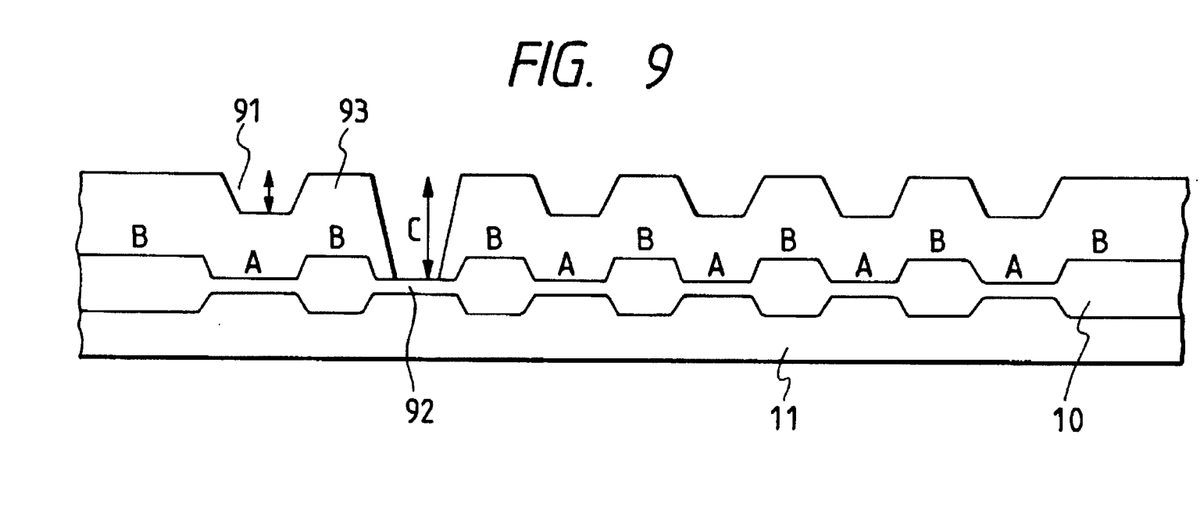
FIG. 9 is a sectional view of a conventional color image sensor.
Figure 10A:
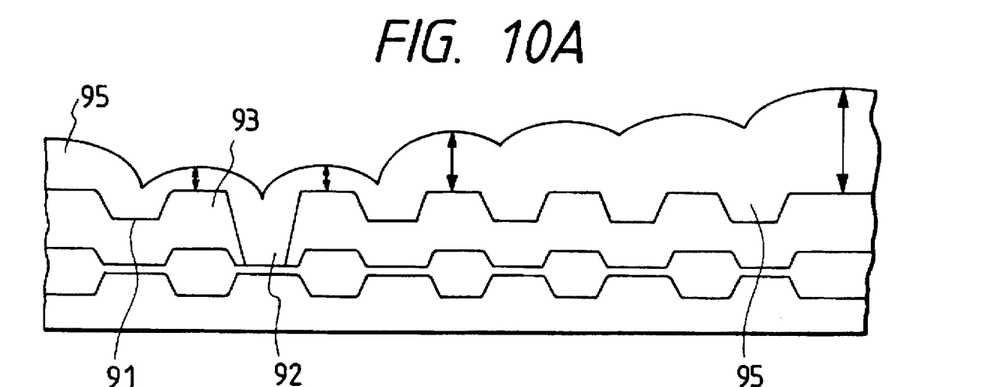
FIGS. 10A to 10C are sectional views showing a state wherein the conventional color image sensor is coated with a color filter without planarizing scribe grooves.
Figure 10B:
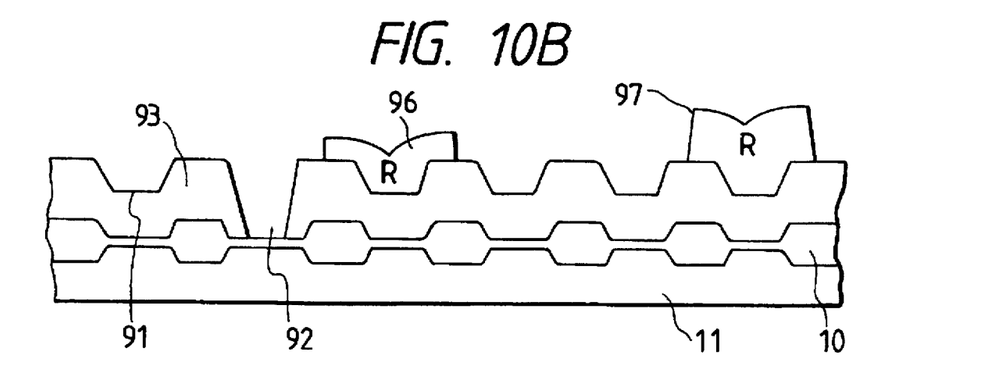

As a result, as shown in FIG. 9, at the end of the semiconductor process, photoelectric conversion portions 91, scribe regions 92 serving as a cutting path upon cutting into solid-state image pickup chips, and peripheral portions 93 around each scribe region 92 are formed on a semiconductor substrate 11, and with these portions, steps of several μm are formed. In this state, when these chips are coated with color filters, the respective color filters are required on only each photoelectric conversion portion 91, but the color filters have different film thicknesses on a portion near each scribe region 92 on the chip, and on a portion near the central portion as the intermediate portion sandwiched between adjacent scribe regions, as shown in FIG. 10A. In a process of coating the chips with color filters in units of three colors, as shown in FIG. 10B, the film thickness near the scribe region 92 becomes different from that of a central portion 95 between adjacent scribe regions in units of colors.

This is because the coated color filter material collects in a low-level portion, i.e., the scribe region 92, although the chips are coated with the color filters using a spin coater. As a result, a sensitivity variation is generated between bits defined by a plurality of photoelectric conversion elements.

This problem is avoided by arranging the photoelectric conversion portions to be separated from the peripheral portion of each chip by a certain distance. However, with this method, the number of chips which can be cut per wafer decreases.

In a chip array type color solid-state image pickup device, a more serious problem is posed. In the chip array type solid-state image pickup device, a plurality of solid-state image pickup chips are arranged in correspondence with the reading width equal to the size of an original to allow reading at an equal magnification. According to the chip array type color solid-state image pickup device, a solid-state image pickup device can be rendered compact, and a size reduction of the entire structure can be realized, although a reading device using a reduction optical system requires a wide optical system space. The chip array type color solid-state image sensor will be referred to as a multi-chip type color image sensor in the following description of this specification.

Figure 10C:
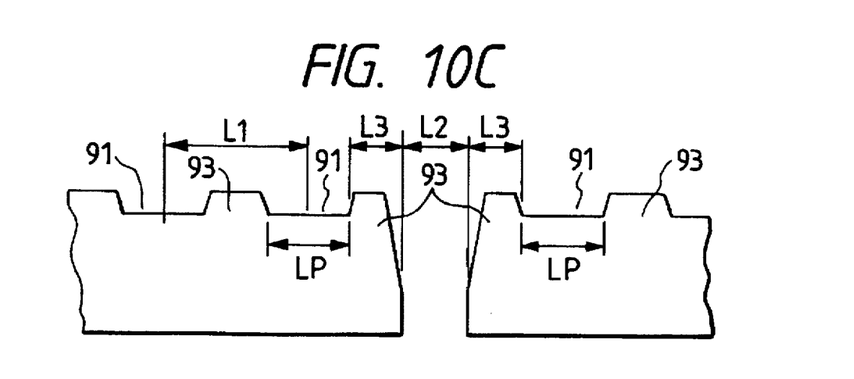
Figure 11A:
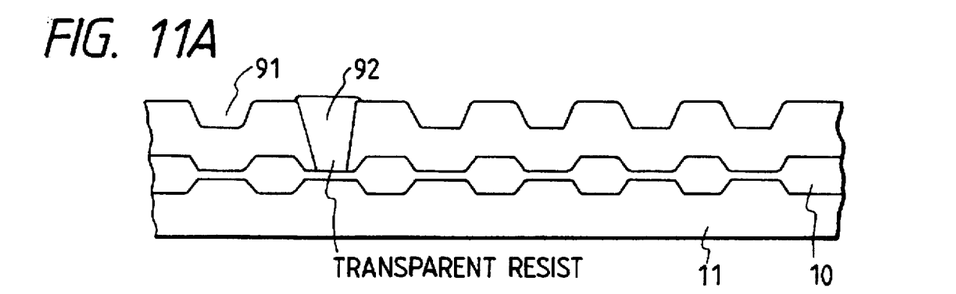
FIGS. 11A to 11F are sectional views showing the flow of a color filter process of the conventional color image sensor.
Figure 11B:
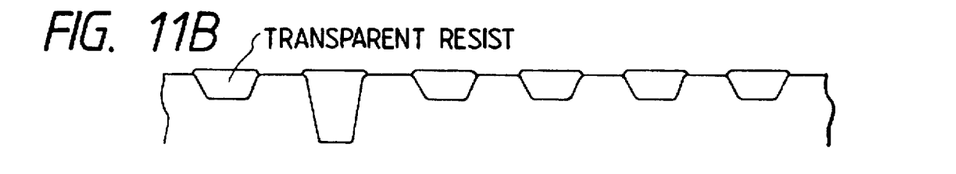
Figure 11C:
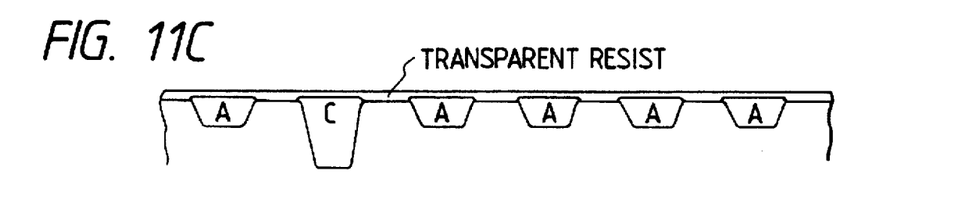
Figure 11D:
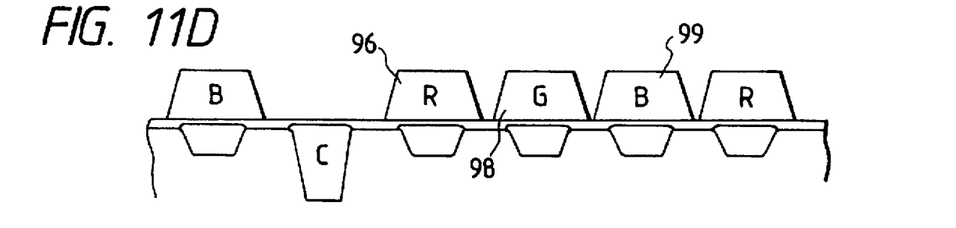
Figure 11E:
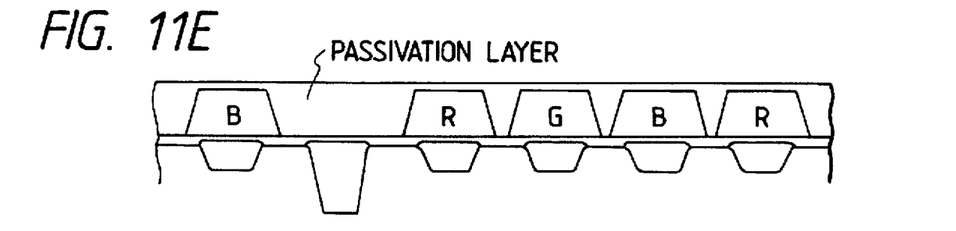
Figure 11F:
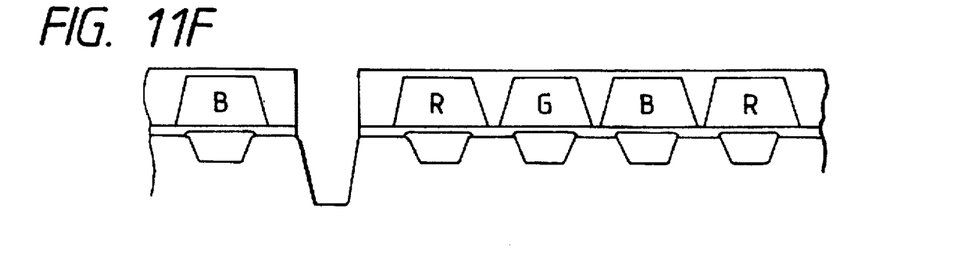

On the other hand, in the multi-chip type color image sensor, the joint portion between adjacent solid-state image pickup chips must be reduced as much as possible. More specifically, there is no technique of manufacturing photoelectric conversion elements and their peripheral circuits at once on the entire wafer, but photoelectric conversion circuits having predetermined functions are constituted in units of chips. Therefore, the degree of proximity between adjacent chips is important. In addition, the packing density of chips must be increased. In this case, the pitch, L1, of the photoelectric conversion portions is determined by the reading resolution of an original to be read. FIG. 10C shows the dimensional layout relationship between adjacent solid-state image pickup chips.

For example, if the number of dots to be read per inch is 200 dpi, the pitch L1=127 μm must be set. The joint portion must not largely deviate from this pitch even between adjacent chips. Since the distance, L2, between adjacent chips, is limited to some extent due to the limitation on mounting precision, the distance, L3, between the photoelectric conversion portion at the edge portion of the chip and the peripheral portion of the chip must satisfy:

$$L1-Lp-\Delta < L2+2\times L3 < L1-Lp+\Delta \tag{1}$$

(where Δ is the allowable range, and Lp is the width of the photoelectric conversion portion.) For this reason, the distance L3 between the photoelectric conversion portion at the edge portion of the chip and the peripheral portion of the chip must be reduced as much as possible.

In general, the distance L2 between adjacent chips is, e.g., about 20 μm although it depends on mounting devices. If the width Lp of the photoelectric conversion portion is 70 μm, L3 is about 18 μm. This distance easily causes coating nonuniformity of color filters.

In the multi-chip type color image sensor, to solve this problem, a process of planarizing grooves formed by the scribe regions on the surface, and a process of planarizing grooves formed by the photoelectric conversion portions on the surface are added in the color filter process. FIGS. 11A to 11F show the current color filter process. This process is executed in the order of FIGS. 11A to 11F. In order to eliminate steps on the surface of the device, each scribe region 92 that defines the largest step is planarized using a transparent resist [FIG. 11A]. Then, each photoelectric conversion portion 91 serving as a metal wiring opening portion is planarized using a transparent resist [FIG. 11B]. In order to eliminate steps on the device surface, the entire surface of the device is coated with a transparent resist [FIG. 11C]. Then, coating and patterning for red (96), blue (98), and green (99) color filters are sequentially repeated, thus forming color filters [FIG. 11D]. Furthermore, in order to protect the respective filters, a passivation layer is formed on the entire surfaces of the respective color filters [FIG. 11E]. Finally, a transparent resin in each scribe region is removed [FIG. 11F]. Thereafter, respective solid-state image pickup chips are cut along the scribe regions using, e.g., a dicing cutter.

In the current color filter process, since a step of several µm is formed between the photoelectric conversion portion and the scribe region, it is difficult to simultaneously perform planarization of scribe grooves and planarization of photoelectric conversion portion grooves. For this reason, the two planarizing processes are required, resulting in an increase cost in association with the processes. The above-mentioned method is also applied to color solid-state image pickup devices other than the multi-chip type color image sensor, thus posing a problem.

SUMMARY OF THE INVENTION

According to the present invention, a portion of a scribe region used for separating color solid-state image pickup device chips is designed to have the same film structure as that of a photoelectric conversion portion, so as to eliminate a step between the photoelectric conversion portion and the scribe region in the vicinity of at least the photoelectric conversion portion, thereby allowing uniform coating of photoelectric conversion portions corresponding to all the bits with color filters. As a result, at least one scribe region planarizing step can be omitted, and an inexpensive, high-resolution color solid-state image pickup device can be provided.

In an image pickup element which is obtained in such a manner that a plurality of photoelectric conversion portions are formed on a semiconductor substrate, a color filter layer is formed on the plurality of photoelectric conversion portions, grooves are formed between adjacent ones of the plurality of photoelectric conversion portions, and the photoelectric conversion portions are separated, a process for filling grooves between adjacent photoelectric conversion portions is performed before the color filter layer is formed on the plurality of photoelectric conversion portion.

DETAILED DESCRIPTION OF THE PREFERRED EMBODIMENTS

Figure 1A:
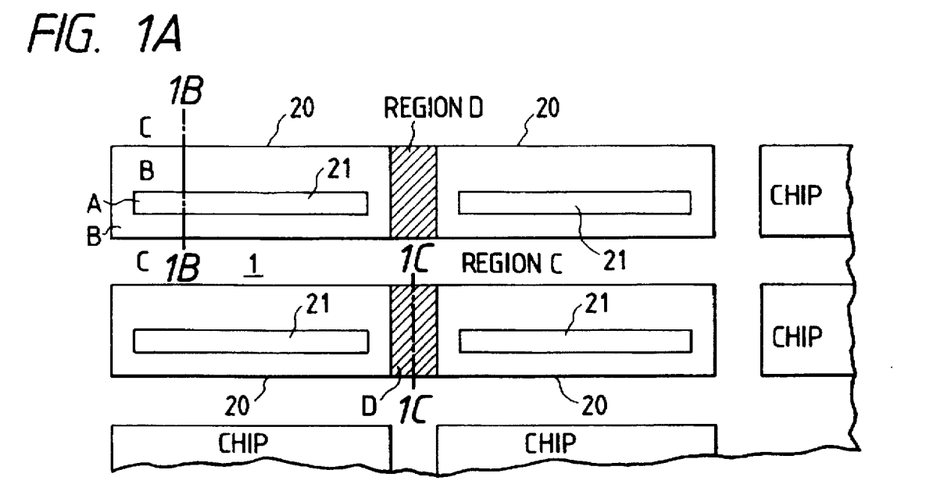
FIGS. 1A to 1C are respectively a plan view and sectional views showing the structure of a color image sensor, which best illustrate the characteristic feature of the present invention.
Figure 1B:
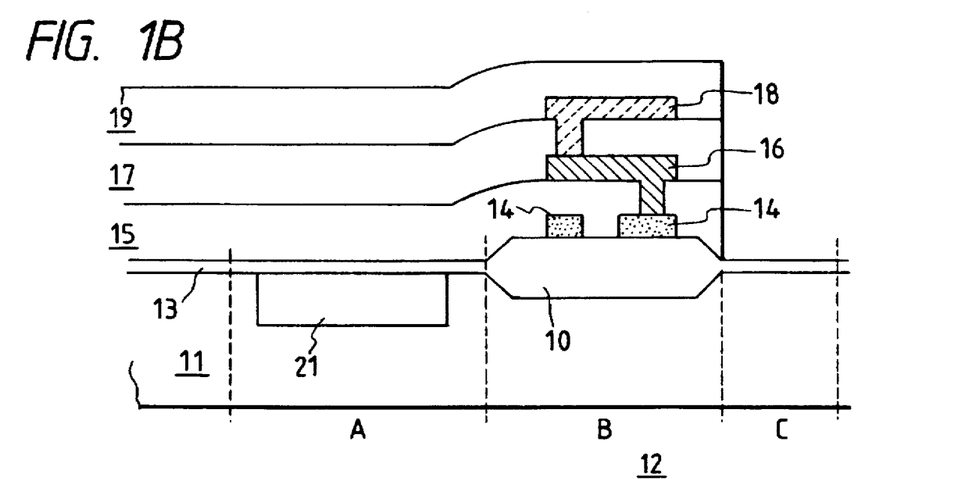
Figure 1C:
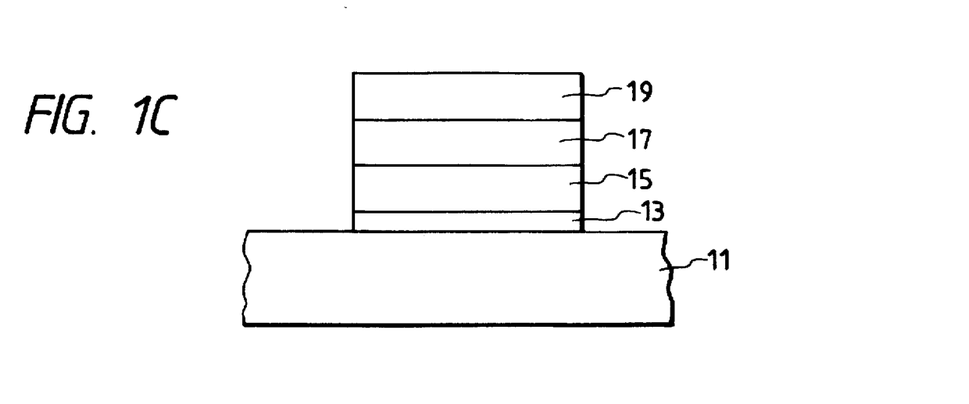

The preferred embodiments of the present invention will be described in detail below with reference to the accompanying drawings. FIG. 1A is a plan view of a solid-state image pickup device, FIG. 1B is a sectional view of the device taken along a line 1B—1B in FIG. 1A, and FIG. 1C is a sectional view of the device taken along a line 1C—1C in FIG. 1A. In FIG. 1B, a photoelectric conversion portion (a region A), a peripheral portion (a region B) including switches, wiring layers, and the like, and a scribe region (a region C) are formed on a semiconductor substrate 11. In FIG. 1A, a region 12 corresponds to the scribe region C as a boundary in the up-and-down direction, and of this region, only the scribe region D as a boundary in the right-and-left direction has the same film structure as that of the photoelectric conversion portion A. FIG. 1C is a sectional view taken along a line 1C—1C in FIG. 1A. The photoelectric conversion portion (region A) in FIG. 1B comprises a photodiode, and a bipolar type photosensor, or a MOS type photosensor such as a CMD, and the present invention is not limited to a specific photoelectric conversion element. Independently of the photosensor to be adopted, a sensor portion is formed on the semiconductor substrate 11, and a transparent insulating layer is formed thereon. In FIGS. 1A to 1C, a two-layered metal wiring process has been exemplified. However, the present invention is not limited to this process.

In FIGS. 1A to 1C, an insulating layer 13 consists of, e.g., $SiO_2$, and normally has a thickness of 100 nm or less, e.g., about 300 Å. A polysilicon layer 14 forms electrodes and wiring lines and normally has a thickness of 500 nm or less. An insulating layer 15 for isolating between a metal wiring layer 16 and the polysilicon layer 14 consists of NSG, PSG, SiN, or the like, and normally has a thickness of 1,000 nm or less. An insulating layer 17 isolates between a metal wiring layer 18 and the metal wiring layer 16, and has the same material and thickness as those of the insulating layer 15. A passivation layer (protection film) 19 has the same material and thickness as those of the insulating layer 15. A LOCOS oxide film 10 consists of local silicon oxide, and normally has a thickness of 1 µm or less. Assuming that the LOCOS oxide film 10, the insulating layer 13, the insulating layer 15, the insulating layer 17, and the passivation layer 19 respectively have thicknesses of 700 nm, 25 nm, 700 nm, 700 nm, and 900 nm, and the polysilicon layer 14, the metal wiring layer 16, and the metal wiring layer 18 respectively have thicknesses of 400 nm, 800 nm, and 1,200 nm, the heights of the regions A, B, D, and C with reference to the surface of the semiconductor substrate 11 are respectively about 2.3 µm, 5 µm, 2.3 µm, and 0.1 µm.

Figure 2A:
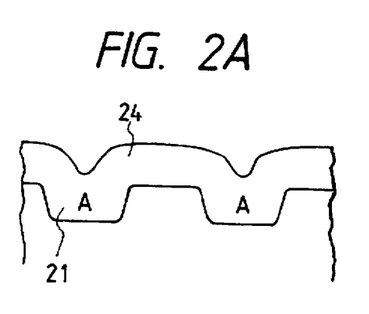
FIGS. 2A and 2B are sectional views showing a state wherein the substrate is coated with a color filter using the structure of the present invention.
Figure 2B:
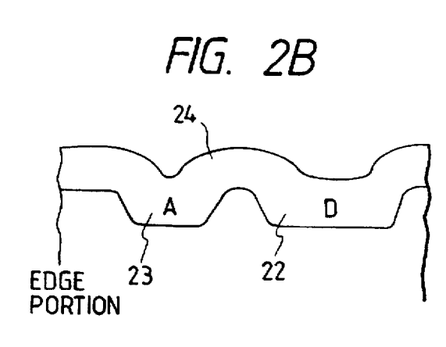

FIGS. 2A and 2B show a state wherein the above-mentioned semiconductor substrate is coated with a given color filter without any planarizing process.

FIGS. 2A and 2B correspond to the section portion of the surface portion shown in FIG. 1B. FIG. 2B shows the region A corresponding to a photoelectric conversion portion (23) near the scribe region D (22) at the chip edge, and FIG. 2A shows the region A corresponding to a photoelectric conversion portion (21) at the center of the chip. Since the scribe region D (22) has substantially the same height as that of the region A corresponding to the photoelectric conversion portion (23), coating nonuniformity can be greatly eliminated as compared to a conventional structure.

Figure 3A:
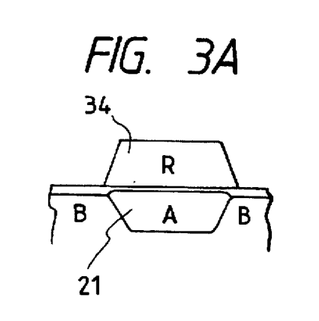
FIGS. 3A and 3B are sectional views showing a state wherein the substrate is coated with a color filter using the structure of the present invention.
Figure 3B:
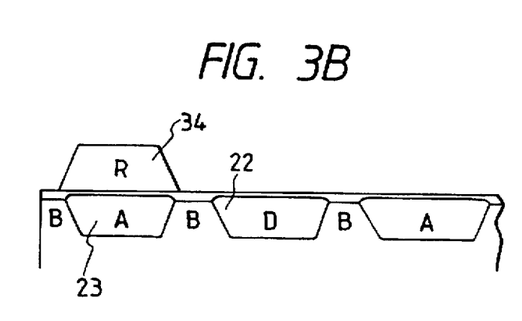

FIGS. 3A and 3B show a state wherein coating of the substrate with a color filter 34 is performed after only the planarizing process of the photoelectric conversion portion is performed. FIG. 3A shows a structure in which a red filter 34 is formed by coating on the central photoelectric conversion portion 21 corresponding to an intermediate region between adjacent scribe regions 22, and FIG. 3B shows a structure in which a red filter 34 is formed by coating on the photoelectric conversion portion 23 near the scribe region 22. In this case as well, since the scribe region D has substantially the same structure and height as those of the photoelectric conversion portion (23), the color filters (34) formed by coating on the photoelectric conversion portion (23) at the chip edge and the photoelectric conversion portion (21) at the center of the chip have substantially the same thicknesses.

When the substrate is directly coated with the color filter without performing the planarizing process of the scribe region and the planarizing process of the photoelectric conversion portion in the conventional process, a variation between bits, on the central portion of the chip and on a portion near the scribe region, in the photoelectric conversion portion can be eliminated although the sensitivity slightly deteriorates due to a slightly distorted color filter shape. Therefore, since the planarizing processes can be omitted, an inexpensive color image sensor can be provided. Even when the planarizing process is performed to improve the optical sensitivity of the photoelectric conversion elements before coating with the filters, the planarizing process of the scribe region can be omitted, and an inexpensive color image sensor, which is free from a variation between bits, and has performance equivalent to that obtained via the conventional planarizing processes, can be obtained.

An important point of the present invention is the size of the region D shown in FIG. 1A. The region D will be described below. In order to uniformly coat the color filters, the scribe regions C and D preferably have the same film structure as that of the photoelectric conversion portion A. However, in the separation/mounting process, since the insulating layers 15 and 17 present in the photoelectric conversion portion A are high-hardness portions such as silicon dioxide (SiO$_2$), the blade of a dicing cutter is considerably degraded. In addition, the insulating layers present in the scribe region D crack upon dicing, and the crack reaches the element region in the chip, resulting in a decrease in yield. Therefore, the above-mentioned preferable structure has a trade-off relationship with the decrease in yield. In addition, another problem is posed in the semiconductor process. More specifically, contact holes are formed in the insulating layers to form wiring layers on the semiconductor substrate. In this case, in order to confirm if the contact holes completely extend through the insulating layers, RIE (reactive ion etching) and WET etching require a large-area Si surface such as the scribe region. Therefore, the region D is preferably as small as possible.

Figure 4:
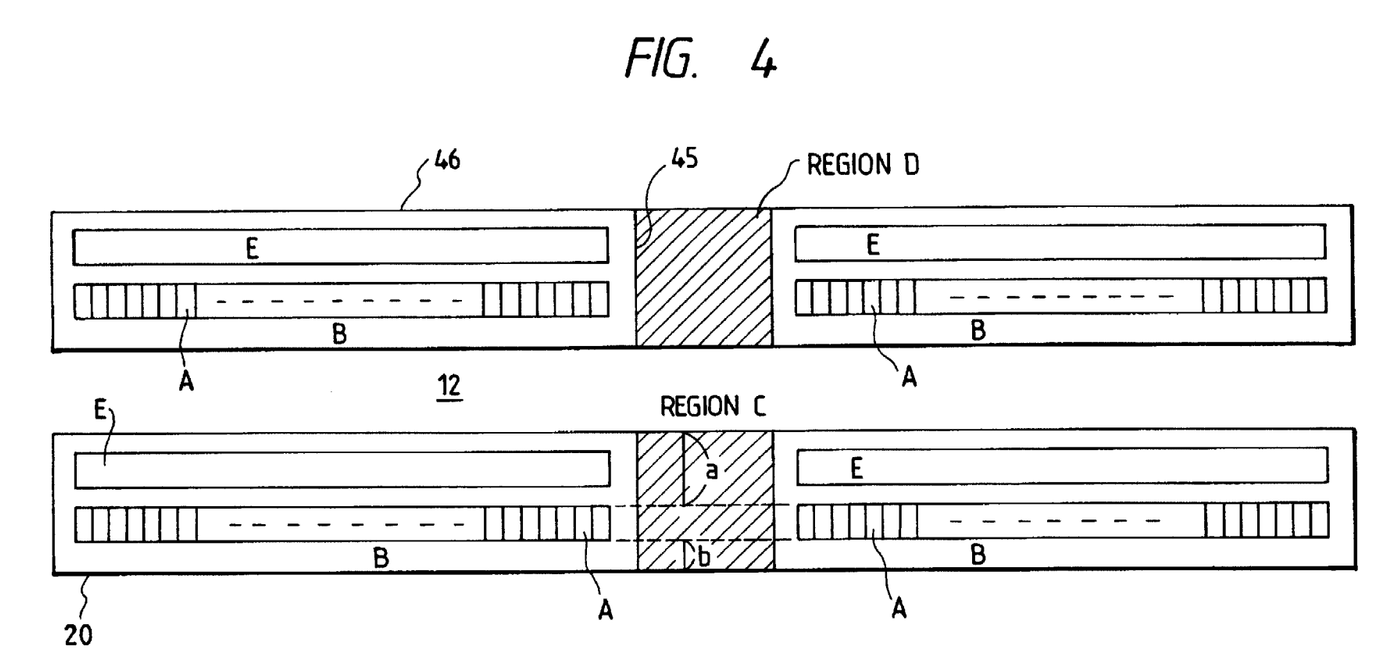
FIG. 4 is a plan view of a wafer when the present invention is applied to line sensor.

FIG. 4 is a plan view of a semiconductor substrate on which a line sensor comprising solid-state image pickup devices is formed. In FIG. 4, the line sensor includes sensor chips 20 using solid-state image pickup chips, a scribe region 12, photoelectric conversion portions A, peripheral circuit portions B, a scribe region C with a step in the scribe region 12, from which insulating layers are removed each time the insulating layer is formed like in the conventional method, scribe regions D in the scribe region 12, which are constituted by layers having the same thicknesses as those of the photoelectric conversion portions A, and driving circuit portions E.

A variation in optical sensitivity of the photoelectric conversion portions A poses a problem in the horizontal direction, i.e., a direction parallel to a side 46, and a variation in a region between the central portion of the photoelectric conversion portion A and a portion near a side 45 on one chip 20 poses a problem. When the scribe region D is assured to contact the entire side 45, the grooves exist only in the vertical direction. These grooves are periodic and provided equivalently to each pixel, so that very little difference in shape of a filter between pixels is resulted in and, therefore, a sensitivity variation can be greatly eliminated. Since the line sensor satisfies:

[length of side 45]<<[length of side 46]

the scribe region D is sufficiently small, and the above-mentioned problem associated with the dicing cutter in the mounting process is negligible. However, in order to improve the yield in the mounting process, distances a and b in FIG. 4 other than the size, in the horizontal direction, of the photoelectric conversion portion A must be reduced. However, these widths correspond to those of the driving circuit portion E and the peripheral circuit portion B with large steps on the sensor chip 20, and only the horizontal direction of the photoelectric conversion portion A influences a variation of the photoelectric conversion portion. For this reason, the limit values of the distances a and b are determined by the precision of sensitivity variation and the viscosity of color filters. Since the color filters are required only on the photoelectric conversion portion, but are not required on the portions a and b in the scribe region, the distances a and b can be smaller as the color filters have higher viscosity.

Figure 5A:
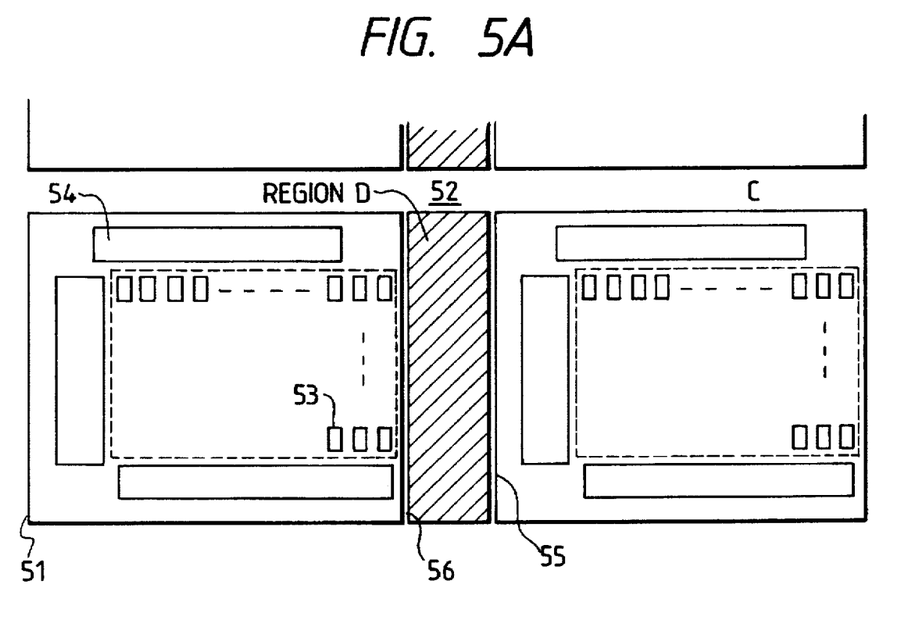
FIGS. 5A and 5B plan views of a wafer when the present invention is applied to an area sensor.
Figure 5B:
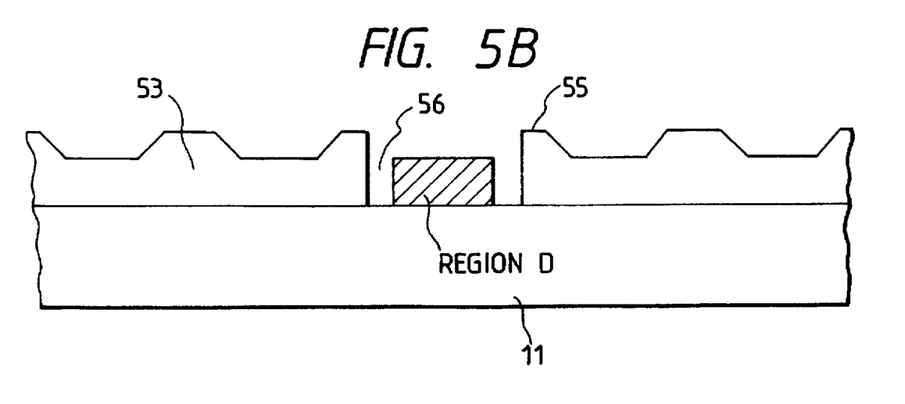

FIGS. 5A and 5B are respectively a plan view and a sectional view of a semiconductor substrate on which an area sensor comprising solid-state image pickup devices is formed. Referring to FIGS. 5A and 5B, the area sensor includes sensor chips 51 as solid-state image pickup chips, a scribe region 52, photoelectric conversion portions 53, peripheral circuit portions 54 including driving circuits, a region C with a step in the scribe region 52, and a region D in the scribe region 52, which is constituted by the same layers as those of the photoelectric conversion portions 53. In the case of the area sensor, a sensitivity variation poses a problem not only in the horizontal direction but also in the vertical direction. Therefore, the peripheral circuit portions 54 and the like are preferably arranged along at least two opposing sides of the region of the photoelectric conversion portion 53 so as to assure a certain distance between the photoelectric conversion portion and the scribe region in one direction, thereby eliminating sensitivity variation factors. More specifically, in one direction, the photoelectric conversion region is preferably arranged at the center of the chip.

In an example to be described below, the peripheral circuit portions are arranged inside the three sides of the sensor chip, and the photoelectric conversion region is arranged near the center of the chip in the vertical direction in FIGS. 5A and 5B. A scribe region in question is the scribe region D contacting a side 55. In this case, when the region D is assured to contact the entire side 55 like in the line sensor, not only the blade of the dicing cutter but also a decrease in yield of the chips due to cracks formed in insulating layers pose a serious problem. Thus, as shown in FIG. 5B, gaps 56 are formed so that the region D is arranged in an island pattern, thereby suppressing cracks from reaching the interior of the chip. Strictly speaking, coating nonuniformity occurs due to the influence of the gaps 56. However, when the gaps 56 are set to have a minimum rule, a sensitivity variation between bits of the photoelectric conversion portion 53 after coating with filters can be suppressed.

Since solid-state image pickup devices were formed in practice using the technical concept of the present invention, and their effect were confirmed, these devices will be described below as examples.

EXAMPLE 1

Figure 6:
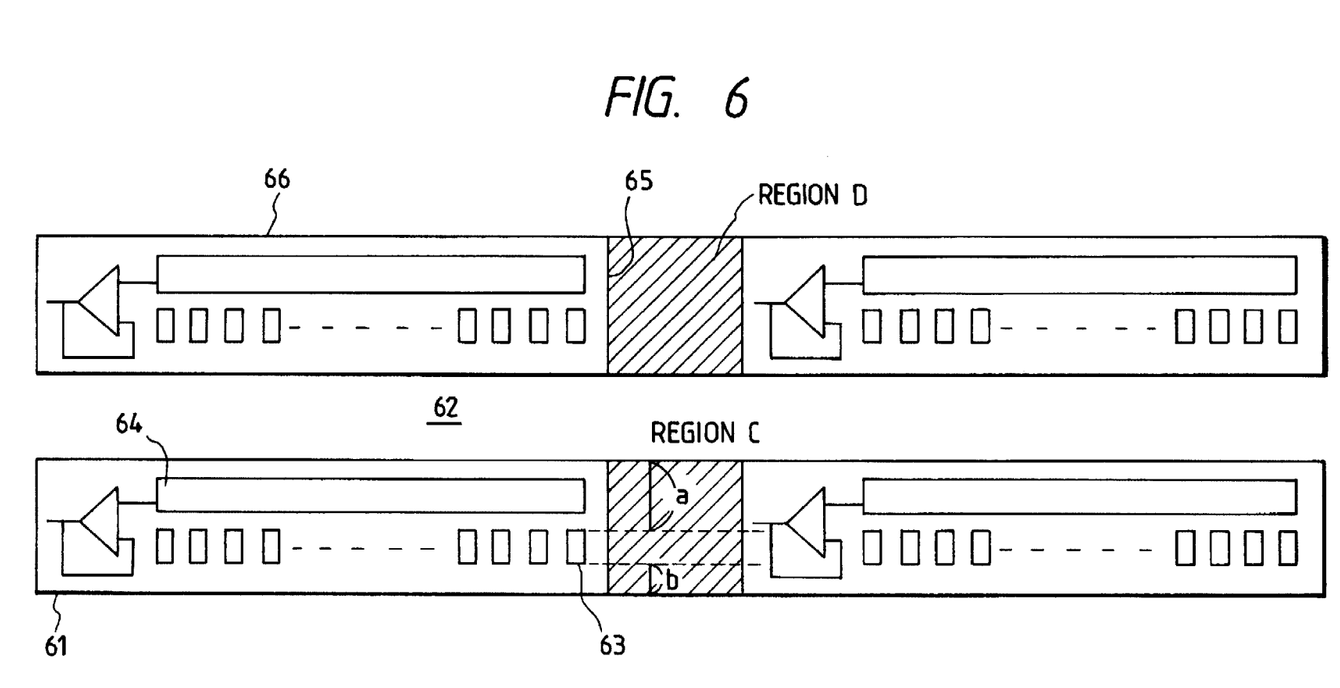
FIG. 6 is a plan view showing a wafer to explain Example 1.

This example will be explained below with reference to FIG. 6. In this example, a CCD color sensor consisting of two polysilicon layers, two aluminum wiring layers, and a light-shielding aluminum layer was manufactured. In FIG. 6, the sensor includes color line sensor chips 61, a scribe region C (62), and photodiode arrays 63 of photoelectric conversion elements. Of the scribe region C, a silicon surface was exposed from the region C, while a region D was formed to have the same film structure as that of the photodiodes of the photoelectric conversion portion 63 in such a manner that insulating layers were formed in the same insulating layer forming process, and the insulating layers were removed by patterning from only the scribe region C parallel to the longitudinal direction of the photoelectric conversion portion 63.

In this example, in the photodiode portion 63 as the photoelectric conversion portion and the scribe region D, a gate oxide film consisting of silicon thermal oxide, a first insulating layer for isolating between first and second polysilicon layers, and a first aluminum wiring layer, a second insulating layer for isolating between the first aluminum wiring layer and a second aluminum wiring layer, a third insulating layer for isolating between the second aluminum wiring layer and a light-shielding aluminum layer, and a passivation layer were deposited in turn on the surface of a semiconductor substrate 11.

A line sensor using a CCD for charge transfer was manufactured in such a manner that only a planarizing process for filling grooves of the photoelectric conversion portions 63 was performed on the semiconductor substrate 11, one color filter was formed by coating and patterning to remove a portion except for necessary color filter portions so as to sequentially form red, blue, and green filters.

In this formation process, a satisfactory CCD line sensor free from a sensitivity variation between bits was manufactured without performing any planarizing process of scribe grooves. Since the step between the scribe region D and the region C was about 3 μm, if no planarizing process of scribe grooves was performed in the conventional method, the color filter flowed into the grooves of the scribe region, and the color filters have different shapes on a portion in the vicinity of the scribe region and at the central portion of the chip, thus causing a sensitivity variation between bits. As compared to the conventional method of avoiding coating nonuniformity of the color filters due to the presence of scribe grooves by separating the photoelectric conversion portion from the chip edge after only the planarizing process of the grooves of the photoelectric conversion portions was performed, the number of chips which could be cut per wafer could be improved by 5% although the processes remained the same.

EXAMPLE 2

Figure 7:
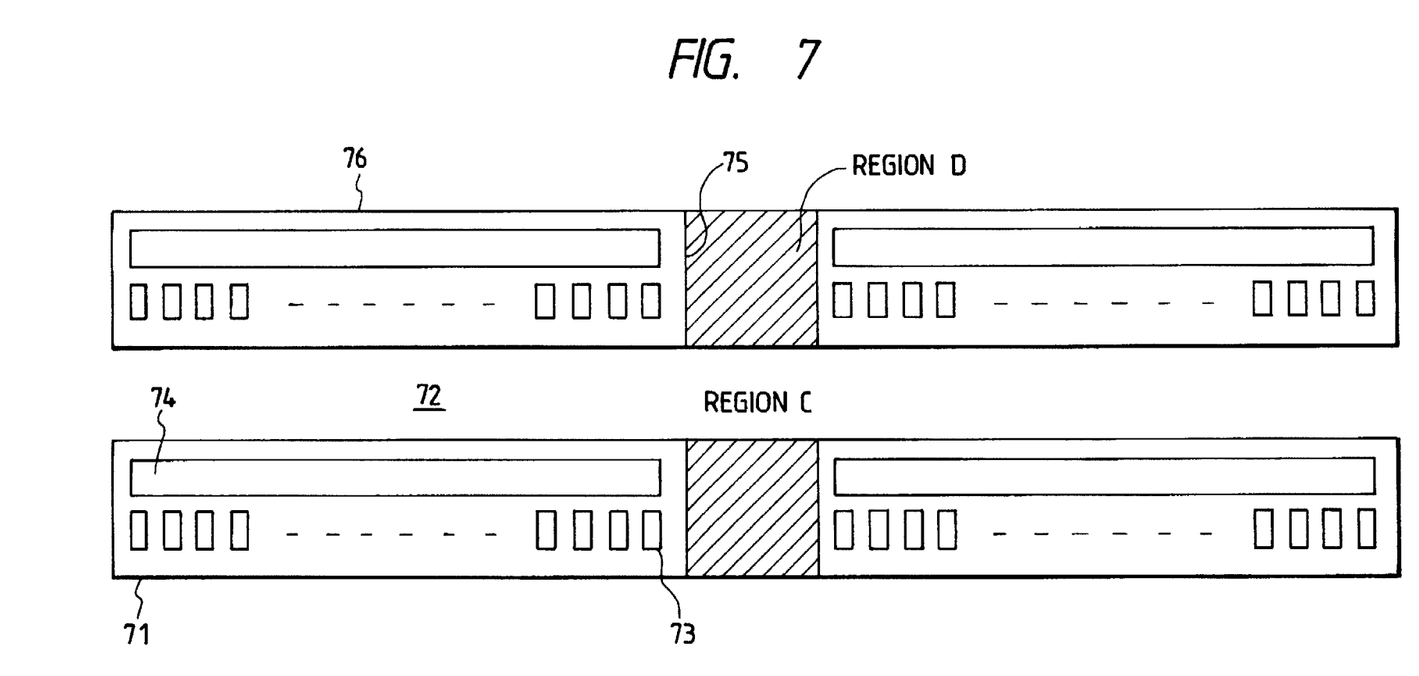
FIG. 7 is a plain view showing a wafer to explain Example 2.

EXAMPLE 2 will be explained below with reference to FIG. 7. In this example, a base accumulation bipolar transistor type color line sensor consisting of one polysilicon layer, and two aluminum wiring layers was manufactured. In FIG. 7, the sensor includes color line sensor chips 71, a scribe region 72, and photoelectric conversion portions 73. Of the scribe region 72, a silicon surface was exposed from a region C, while a region D was manufactured to have the same film structure as that of the photoelectric conversion portion. In this example, in the photoelectric conversion portion 73 and the region D, a gate oxide film consisting of silicon thermal oxide, a first insulating layer for isolating between first and second polysilicon layers, and a first aluminum wiring layer, a second insulating layer for isolating between the first aluminum wiring layer and a second aluminum wiring layer, and a passivation layer were deposited in turn on the surface of a semiconductor substrate.

A base accumulation bipolar transistor type color line sensor was manufactured in such a manner that only a planarizing process for filling grooves of the photoelectric conversion portions 73 was performed with respect to the semiconductor substrate, and a color filter was formed by coating and patterning to sequentially form red, blue, and green filters. In this case, the step between the regions D and C of the scribe region 72 was about 2 μm or more. In this example, the same effect as in Example 1 was obtained.

EXAMPLE 3

Figure 8:
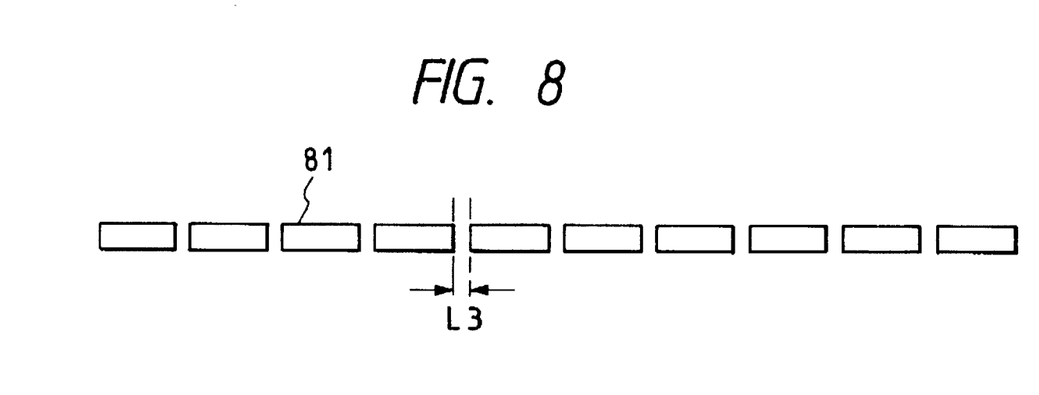
FIG. 8 is a mounting layout view showing a multi-chip type color image sensor to explain Example 3.

Following the same processes as in the base accumulation bipolar transistor type color line sensor manufactured in Example 2, color line sensor chips having 158 bits×3 colors per chip were formed. The distances L2, L3, and Lp described above was set to be 15 μm, 8 μm, and 20 μm, respectively, and 10 color sensor chips were aligned in line to manufacture an A4-size paper equal-magnification system multi-chip type color line sensor that could directly read an original (see FIG. 8). Since the multi-chip structure was adopted, the minimum distance between the photoelectric conversion portion and the scribe region was 8 μm. However, a low-cost multi-chip type color image sensor free from a sensitivity variation between bits due to the color filter shape difference could be manufactured without performing any scribe groove planarizing process.

EXAMPLE 4

In this example, a CCD color area sensor consisting of two polysilicon layers, two aluminum wiring layers, and a light-shielding aluminum layer was manufactured. The photoelectric conversion portion 53 and the peripheral circuit portions 54 were arranged, as shown in FIGS. 5A and 5B. On the other hand, the region D of the scribe region 52 was formed in an island pattern. In FIGS. 5A and 5B, the gap 56 between the chip 51 and the scribe region D was set to be 2 μ. The film structure of the photodiode portion as the photoelectric conversion portion 53 and the region D was the same as that in Example 1. As for coating nonuniformity of color filters, the same effect as in Example 1 was obtained. Since the area sensor was manufactured, the area of the region D was larger than that in the line sensor. For this reason, if the region D was formed adjacent to the chip as in Examples 1 to 3, the yield lowered due to cracks formed in insulating layers upon dicing. However, since the 2-μm wide gap 56 was assured like in this example, a decrease in yield due to cracks could be prevented. Such an arrangement can be applied to the line sensor.

For example, a plurality of solid-state image pickup chips cut along the regions D in each of the above-mentioned examples are aligned in a line to constitute a line sensor for directly reading a real-size original image. In this case, the pitch between the photoelectric conversion portion at the chip edge portion and that on an adjacent chip is set to be equal to the pitch between other photoelectric conversion portions as much as possible. However, the regions D cannot be entirely removed, and they inevitably remain to some extent so as not to cause cracking of the photoelectric conversion portions upon cutting. Therefore, the regions D at the edge portions of the chip are not perfectly removed by practicing the present invention. The distance L2 between chips shown in FIG. 10C can be set to be about 20 μm in correspondence with the NTSC system.

As described above, according to the present invention, when a portion, where adjacent sensor chips are connected to each other in terms of a structure, of the scribe region is designed to have the same film structure as that on the photoelectric conversion portion, the planarizing process of scribe grooves can be omitted, and filter portions near the scribe region and separated from the scribe region can have the same film thickness. Even when the photoelectric conversion portion is arranged near the scribe region, a sensitivity variation between bits caused by the non-uniform thicknesses of color filters can be suppressed. As a result, a low-cost color sensor can be provided.

What is claim is:

1. A color solid-state image pickup device which is separated into a plurality of color solid-state image pick-up chips each of which comprises a photoelectric conversion portion and a peripheral circuit portion, which are formed on a semiconductor substrate, said device including a scribe region for separating the color solid-state image pickup chips wherein said scribe region includes a first scribe portion having the same layers as the photoelectric portion and a second scribe portion which is a layer thinner than said first scribe portion, said second scribe portion being arranged along a line of pixels.

2. A device according to claim 1, wherein color filters are formed before the color solid-state image pickup chips are separated on the semiconductor substrate.

3. A device according to claim 1, wherein when the color solid-state image pickup chips comprise an area sensor, each of the color solid-state image pickup chips has peripheral circuit portions on three sides of the chip, and the scribe region is formed adjacent to the photoelectric conversion portion via a groove.

4. A device according to claim 1, wherein R, G, and B color filters are formed by repeating coating and patterning before the color solid-state image pickup chips are separated on the semiconductor substrate.

5. A chip-array-type color solid-state image pickup device which is comprised by arranging, on a semiconductor substrate, a plurality of color solid-state image pick-up chips, each color solid-state image pickup chip having an array of a plurality of photoelectric conversion portions, said device including a scribe region for separating the color solid-state image pickup chips on said semiconductor substrate wherein said scribe region includes a first scribe portion having the same layers as the photoelectric portion and a second scribe portion which is a layer thinner than said first scribe portion, said second scribe portion being arranged along a line of pixels.

6. A device according to claim 5, wherein color filters are formed before the color solid-state image pickup chips are separated on the semiconductor substrate.

7. A device according to claim 5, wherein when the color solid-state image pickup chips comprise an area sensor, each of the color solid-state image pickup chips has peripheral circuit portions on three sides of the chip, and the scribe region is formed adjacent to the photoelectric conversion portion via a groove.

8. A device according to claim 5, wherein R, G, and B color filters are formed by repeating coating and patterning before the color solid-state image pickup chips are separated on the semiconductor substrate.

* * * * *

UNITED STATES PATENT AND TRADEMARK OFFICE
CERTIFICATE OF CORRECTION

PATENT NO. : 5,698,892

DATED : December 16, 1997

INVENTOR(S) : TORU KOIZUMI, ET AL.

It is certified that error appears in the above-identified patent and that said Letters Patent is hereby corrected as shown below:

On title page,

AT [56] REFERENCES CITED

FOREIGN PATENT DOCUMENTS

"02264468  10/1990  Japan" should read
    --2-264468  10/1990  Japan--.
"03014268  1/1991  Japan" should read
    --3-014268  1/1991  Japan--.

COLUMN 9

Line 18, "chips" should read --chips,--.

COLUMN 10

Line 12, "strate" should read --strate,--.

Signed and Sealed this

Sixteenth Day of June, 1998

Attest:

BRUCE LEHMAN

Attesting Officer

Commissioner of Patents and Trademarks